United States Patent
Hsu et al.

(10) Patent No.: US 7,151,050 B2
(45) Date of Patent: Dec. 19, 2006

(54) METHOD FOR FABRICATING ELECTRICAL CONNECTION STRUCTURE OF CIRCUIT BOARD

(75) Inventors: Shih-Ping Hsu, Hsin-chu (TW); Sao-Hsia Tang, Hsin-chu (TW); Chao-Wen Shih, Hsin-chu (TW); Ying-Tung Wang, Hsin-chu (TW); Wen-Hung Hu, Hsin-chu (TW)

(73) Assignee: Phoenix Precision Technology Corporation (TW)

( * ) Notice: Subject to any disclaimer, the term of this patent is extended or adjusted under 35 U.S.C. 154(b) by 0 days.

(21) Appl. No.: 11/250,110

(22) Filed: Oct. 12, 2005

(65) Prior Publication Data
US 2006/0079081 A1    Apr. 13, 2006

(30) Foreign Application Priority Data
Oct. 12, 2004    (TW) ................................ 093130825

(51) Int. Cl.
*H01L 21/44*    (2006.01)

(52) U.S. Cl. ............... 438/614; 438/612; 438/E21.508; 438/613; 438/E23.015; 257/772; 257/E23.002; 257/E23.021; 257/E23.069

(58) Field of Classification Search ................ 438/612, 438/613, 614; 257/772
See application file for complete search history.

(56) References Cited

U.S. PATENT DOCUMENTS

| 4,087,314 A * | 5/1978 | George et al. ............... 438/614 |
| 6,566,239 B1 * | 5/2003 | Makino et al. .............. 438/612 |

\* cited by examiner

*Primary Examiner*—Quoc Hoang
(74) *Attorney, Agent, or Firm*—Morland C. Fischer

(57) ABSTRACT

A method for fabricating an electrical connection structure of a circuit board is proposed. A patterned resist layer is formed on the circuit board having a plurality of conductive pads, and a plurality of openings is formed in the resist layer to expose the conductive pads. A first conductive material and a second conductive material are successively deposited in the openings of the resist layer and on each of the conductive pads. Then, the resist layer is removed. Subsequently, a protective layer is applied on the circuit board and covers the first and second conductive materials formed on each of the conductive pads. Finally, the protective layer is thinned to expose the second conductive material corresponding in position to each of the conductive pads. Thus, the circuit board can be electrically connected to an external device via the second conductive material.

9 Claims, 3 Drawing Sheets

METHOD FOR FABRICATING ELECTRICAL CONNECTION STRUCTURE OF CIRCUIT BOARD

FIELD OF THE INVENTION

The present invention relates to methods for fabricating electrical connection structures of circuit boards, and more particularly, to a method for fabricating conductive elements on conductive pads of a circuit board by an electroplating process.

BACKGROUND OF THE INVENTION

In the current flip-chip technology, electrode pads are formed on a surface of a semiconductor integrated circuit (IC) chip and corresponding conductive pads are formed on an organic package substrate, such that solder bumps or other conductive adhesive materials can be bonded between the electrode pads of the chip and the conductive pads of the package substrate so as to allow an active surface of the chip to be mounted on the package substrate in a face-down manner. The solder bumps or other conductive adhesive materials are used to provide electrically input/output connections and mechanical connections between the chip and the package substrate.

After a subsequent packaging process of the package substrate, the chip and passive components is performed, a plurality of solder balls are usually mounted on a surface of the substrate to electrically connect the substrate to an external electronic device. In order to effectively mount the solder balls on the substrate, a solder material for implanting the solder balls needs to be in advance applied on the conductive pads of the substrate.

Stencil printing technology is commonly employed to deposit the solder material on the substrate. Referring to FIG. 1, the currently used stencil printing technology mainly involves providing a package substrate 10 having a solder mask layer 11 (such as an insulating resin material) and a plurality of conductive pads 12 for defining locations of a solder material such as solder paste (not shown) on a surface of the package substrate 10. A stencil 13 having a plurality of grids 13a is disposed on the package substrate 10, and the solder material is placed on the stencil 13. Then, a roller 14 is used to repeatedly roll on the stencil 13 or a spraying process is performed to apply the solder material on the conductive pads 12 through the grids 13a so as to form solder (not shown) on the conductive pads 12 after removing the stencil 13. Subsequently, under a condition with a reflow temperature at which the solder would melt, the solder is subjected to a reflow-soldering process to form a soldered element (not shown) on each of the conductive pads 12 of the substrate 10 to be electrically connected to an external electronic device.

In practical implementation, along with the blooming development of various portable devices in the fields of communication, networking and computing, there have been provided different types of packages such as ball grid array (BGA) package, flip-chip package, chip size package (CSP) and multi chip module (MCM), which are characterized with a miniaturized integrated circuit (IC) area, high density and multiple leads, and have become mainstream products on the market for use with highly effective chips such as a microprocessor, a chip set and a graphic chip so as to achieve higher speed operations. However, those package structures must have a reduced width of circuits and a reduced size of conductive pads on substrates thereof. When a pitch between the adjacent conductive pads keeps being reduced, since each of the conductive pads is partly covered by a protective layer formed on the substrate, the size of the conductive pads exposed from the protective layer would further be reduced. This thus causes an alignment problem during subsequent formation of solder bumps on the exposed conductive pads using the stencil printing technology. Moreover, in consideration of the occupied space and the height of the protective layer, the size of grids or openings of the stencil should be accordingly decreased, thereby making fabrication of such stencil become difficult and also increasing the fabrication costs of the stencil. This may further make the solder material hard to pass through the small grids of the stencil and lead to difficulty in fabrication.

Furthermore, the production accuracy of the solder material depends on not only the precise size of the stencil but also the frequency and cleanness of performance of the stencil printing process. Since the solder material has certain viscosity, the more times of printing being performed, the more residues of solder material remain on walls of the grids of the stencil. This causes the amount and shape of the solder material used and formed in the next printing process to be different from those of the predetermined design. Therefore, the stencil needs to be wiped or cleaned after performing certain times of the printing process during practical operation; otherwise, the shape and size of the solder material would become inaccurate or incorrect, and thus convenience and reliability in fabrication are degraded.

Accordingly, an electroplating process is alternatively employed in place of the above stencil printing technology to form the solder material. However, the stencil printing technology and the electroplating process both require a large amount of the solder material to be mounted on the conductive pads to achieve a sufficient height of the solder material for being electrically connected to the external electronic device and to ensure bondability for a subsequent soldering process. This not only increases the costs of the solder material but also makes the fabrication time-consuming as electroplating of the solder material requires a longer period of time. Further, usage of the large amount of solder material needs relatively higher material costs and thus effectively increases the fabrication costs.

SUMMARY OF THE INVENTION

In light of the above drawbacks in the conventional technology, an objective of the present invention is to provide a method for fabricating an electrical connection structure of a circuit board, by which conductive structures are formed on conductive pads located on a surface of the circuit board by an electroplating process.

Another objective of the present invention is to provide a method for fabricating an electrical connection structure of a circuit board, by which a used amount of a solder material is reduced to thereby diminish the material costs and shorten the fabrication time.

Still another objective of the present invention is to provide a method for fabricating an electrical connection structure of a circuit board, by which conductive materials are firstly formed on conductive pads of the circuit board, such that the conductive materials can be effectively fixed by a protective layer that is subsequently formed on the circuit board so as to increase the bonding strength of the conductive materials.

A further objective of the present invention is to provide a method for fabricating an electrical connection structure of a circuit board, which can prevent reduction in size of exposed conductive pads due to a protective layer formed on a surface of the circuit board and avoid an alignment problem during depositing a solder material by the conventional stencil printing technology.

A further objective of the present invention is to provide a method for fabricating an electrical connection structure of a circuit board, which can eliminate drawbacks in the conventional technology, such as difficulty in fabricating a stencil, increase in the fabrication costs of the stencil, and difficulty in passing a solder material through small grids of the stencil, due to the grids of the stencil being reduced in size according to a reduced size and a reduced pitch of conductive pads in the conventional stencil printing technology.

A further objective of the present invention is to provide a method for fabricating an electrical connection structure of a circuit board, which can solve problems of cleaning a stencil after a certain period of time of usage thereof and degradation of convenience and reliability in fabrication caused in the conventional stencil printing technology by residues of a solder material on walls of grids of the stencil being increased along with the times of printing being performed.

In accordance with the above and other objectives, the present invention proposes a method for fabricating an electrical connection structure of a circuit board, which comprises the steps of: providing a circuit board having a circuit layer, applying an insulating layer on a surface of the circuit board wherein the insulating layer is formed with a plurality of openings for exposing portions of the circuit layer thereon, forming a conductive layer on a surface of the insulating layer and in the openings of the insulating layer, and applying a patterned first resist layer on the conductive layer to expose portions of the conductive layer, so as to form a plurality of conductive pads and conductive circuits on the conductive layer by an electroplating process and allow the conductive pads to be connected to the portions of the circuit layer; applying a second resist layer on the circuit board and forming a plurality of openings in the second resist layer to expose the conductive pads; successively forming a first conductive material and a second conductive material on each of the conductive pads by the electroplating process; removing the first and second resist layers and a part of the conductive layer covered by the first resist layer on the circuit board; forming a protective layer on the surface of the circuit board to cover the first and second conductive materials on each of the conductive pads; and thinning the protective layer to expose the second conductive material corresponding in position to each of the conductive pads. In the present invention, the conductive layer and the patterned resist layer are firstly formed on the surface of the circuit board during a surface circuit forming process of the circuit board, so as to form the conductive pads and conductive circuits on the conductive layer by the electroplating process. Subsequently, the first conductive material and the second conductive material are deposited on each of the conductive pads via the conductive layer by the electroplating process. As a result, a copper metal layer (the first conductive material) with a lower material cost and a faster electroplating speed is firstly fabricated, and then a solder material (the second conductive material) with a higher cost and a slower electroplating speed is formed. This only requires a small amount of the solder material, and thus reduces the material costs and shortens the fabrication time. Moreover, the height of the later formed solder material (the second conductive material) can be adjusted via the thickness of the copper metal layer (the first conductive material).

Compared to the conventional technology that a protective layer is firstly formed on a surface of an integrated circuit package substrate and covers the periphery of conductive pads, and then a solder material is deposited on the conductive pads using stencil printing technology, the present invention can solve an alignment problem caused in the conventional stencil printing technology, and eliminate the drawbacks in the conventional technology such as difficulty in fabricating a stencil, increase in the fabrication costs, difficulty to pass the solder material through small grids of the stencil, wiping and cleaning of the stencil, and degradation of convenience and reliability in fabrication, which are caused by the grids of the stencil being reduced in size according to a reduced size and a reduced pitch of the conductive pads. This is because the method for fabricating an electrical connection structure of a circuit board proposed in the present invention continuously uses a conductive layer that is required in fabricating a patterned circuit structure on the circuit board, or forms a conductive layer on a preformed patterned circuit layer of the circuit board, in accompany with a resist layer to perform pattern transfer and cover areas not for forming conductive pads on the circuit board, such that the conductive pads are defined and exposed to be subsequently formed with conductive materials. Then, a first conductive material and a second conductive material are successively electroplated on an upper surface of each of the conductive pads and are sized similar to the upper surface of each conductive pad, such that the conductive materials would have a relatively larger contact area with each conductive pad. Afterwards, a protective layer such as a solder mask layer made of an insulating resin material is applied on the circuit board to cover the first and second conductive materials, and the protective layer is effectively attached to the conductive materials so as to increase the bonding strength of the conductive materials. Further, the protective layer is thinned by a surface etching process to expose the second conductive material that serves for electrically connecting the circuit board to an external device. In the present invention, the first and second conductive materials are formed prior to the protective layer on the circuit board, and the second conductive material is exposed by partially removing the protective layer using a thinning process such as the surface etching process, wherein the second conductive material is also cleaned during the thinning process.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE PREFERRED EMBODIMENTS

FIGS. 2A to 2G show a method for fabricating an electrical connection structure of a circuit board according to a preferred embodiment of the present invention.

Figure 1:
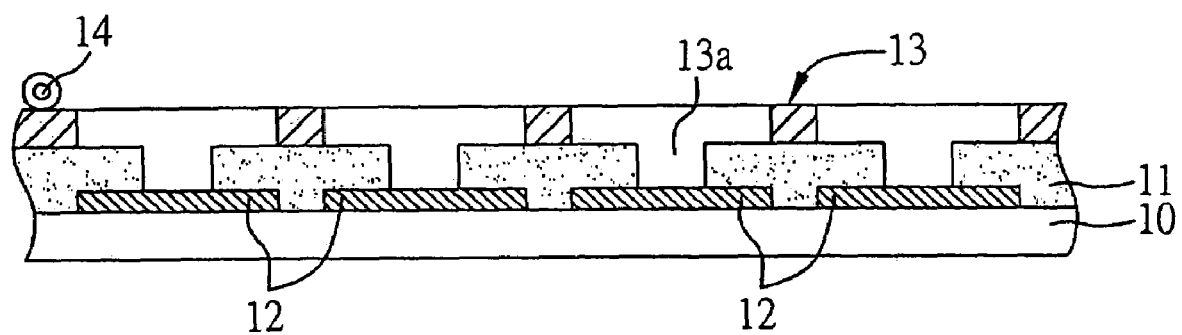
FIG. 1 (PRIOR ART) is a cross-sectional view showing deposition of a solder material on conductive pads of a substrate using conventional stencil printing technology.
Figure 2A:
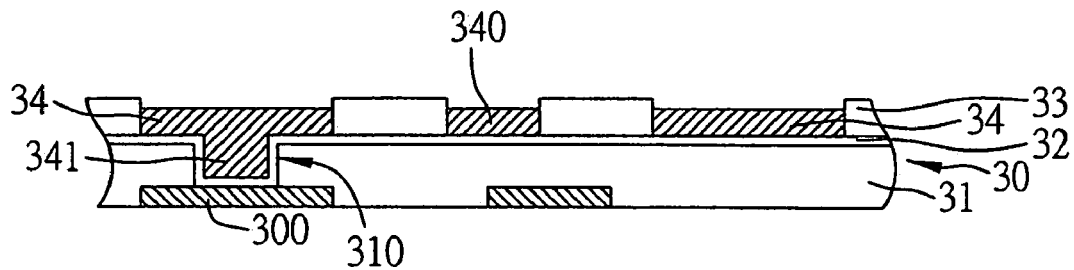
FIGS. 2A to 2G are cross-sectional views showing a method for fabricating an electrical connection structure of a circuit board according to the present invention.

Referring to FIG. 2A, during a surface circuit forming process of a circuit board 30 having a circuit layer 300 thereon, a plurality of openings 310 are formed in an insulating layer 31 applied on a surface of the circuit board 30 to expose portions of the circuit layer 300, wherein the portions of the circuit layer 300 serve as connection lands for electrically interconnecting other circuit layers. It is to be understood that FIG. 2A to FIG. 2G only show the circuit layer 300 formed on the surface of the circuit board 30. In reality the circuit board 30 comprises the other interconnected circuit layers thereunder (not shown in the figs). Then, a conductive layer 32 is formed on a surface of the insulating layer 31 and in the openings 310, and is partly connected to the portions of the circuit layer 300 of the circuit board 30. The conductive layer 32 serves as a current conductive path for a subsequent electroplating process, and is made of a metal material or an electrically conductive polymer material. A patterned first resist layer 33 is applied on the conductive layer 32 to expose portions of the conductive layer 32, such that a plurality of conductive pads 34 and conductive circuits 340 are formed on the conductive layer 32 and a plurality of conductive vias 341 are formed in the openings 310 by the electroplating process.

Figure 2B:
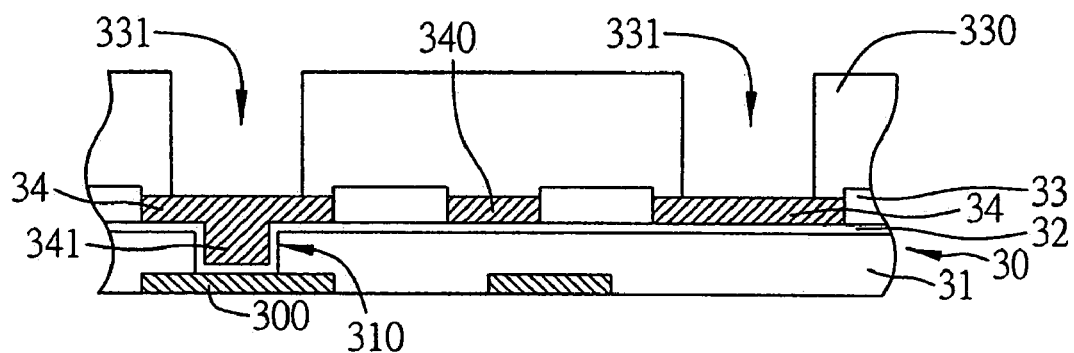

Referring to FIG. 2B, in order to prevent a subsequent conductive material from being electroplated on the conductive circuits 340 where the conductive material should not be deposited, a second resist layer 330 is applied on the circuit board 30 and is formed with a plurality of openings 331 corresponding in position to the conductive pads 34, such that the conductive pads 34 are exposed via the openings 331. The openings 331 in the second resist layer 330 are formed by exposing and developing processes or a laser drilling technique.

Figure 2C:
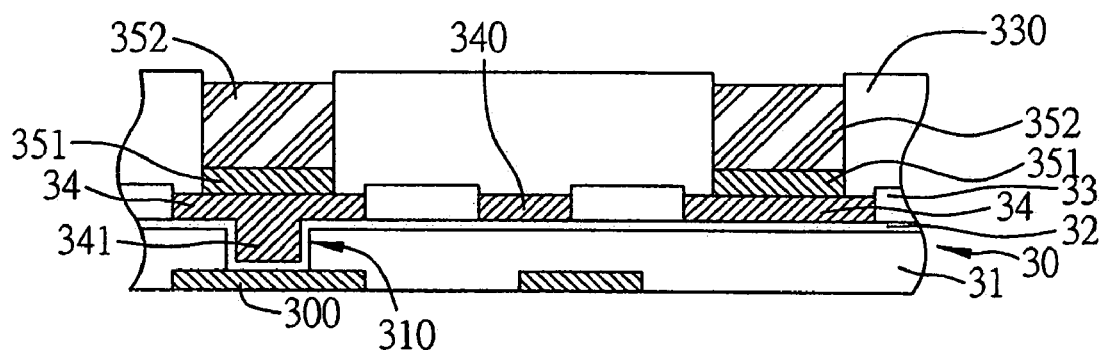

Referring to FIG. 2C, the electroplating process is repeated via the conductive layer 32 to deposit a first conductive material 351 and a second conductive material 352 successively on each of the exposed conductive pads 34. The first and second conductive materials 351, 352 may comprise the same metal material or different metal materials. For example, the first conductive material 351 may comprise a copper metal layer or a metal alloy structure, and is not limited to one layer; the second conductive material 352 may be a solder material. The copper metal layer with a lower material cost and a faster electroplating speed is firstly formed, and then the solder material with a higher cost and a slower electroplating speed is deposited, such that only a small amount of the solder material is required, thereby reducing the material costs and shortening the fabrication time. Moreover, the height of the later formed second conductive material 352 (such as the solder material) can be adjusted via the thickness of the first conductive material 351 (such as the copper metal layer).

Figure 2D:
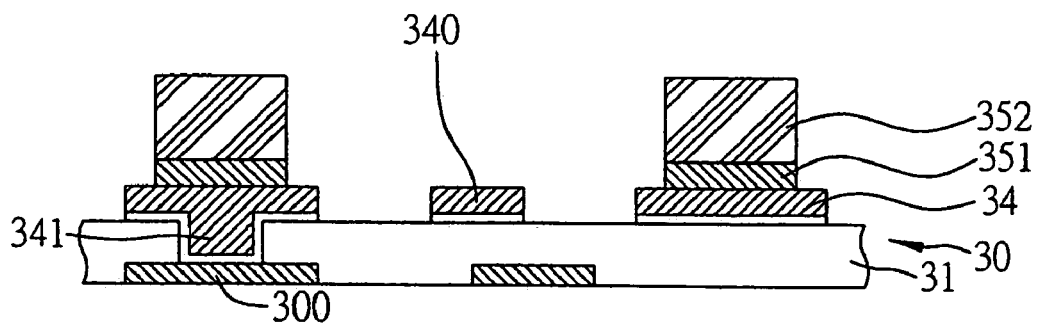

Referring to FIG. 2D, the first and second resist layers 33, 330 formed on the circuit board 30 and a part of the conductive layer 32 covered by the first resist layer 33 are removed.

Figure 2E:
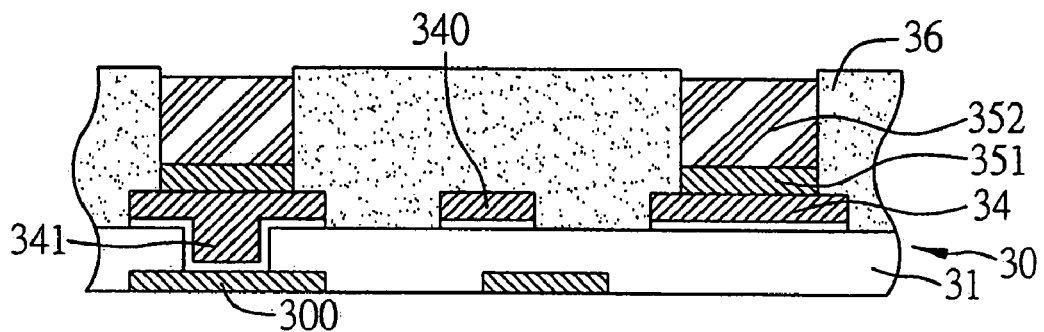

Referring to FIG. 2E, a protective layer 36 is formed on the surface of the circuit board 30 having the first and second conductive materials 351, 352. The protective layer 36 can be a solder mask layer made of such as an insulating resin material.

Figure 2F:
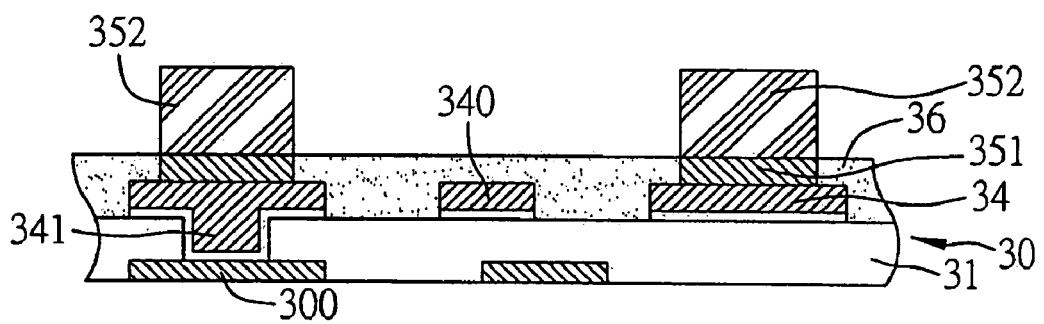

Referring to FIG. 2F, the circuit board 30 is subjected to a thinning process such as a surface etching process. For example, the protective layer 36 can be partly removed using a plasma etching technique, such that the second conductive material 352 is exposed from the protective layer 36, and the circuit board 30 can be electrically connected to an external device via the second conductive material 352.

Figure 2G:
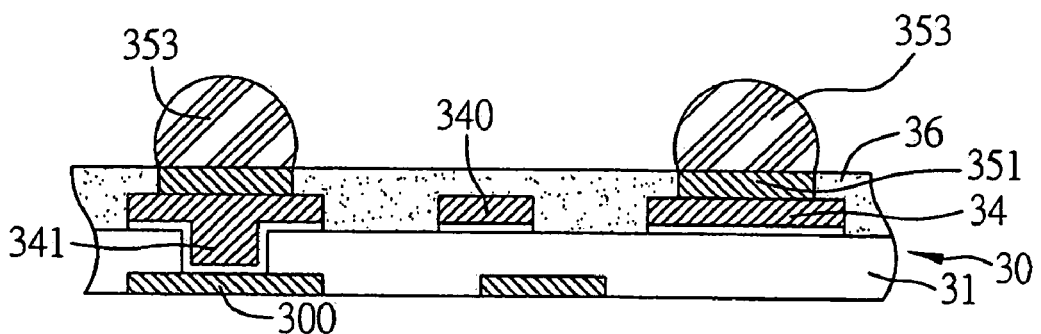

Referring to FIG. 2G, when the second conductive material 352 is the solder material, the solder material can be subjected to a reflow-soldering process to form a solder bump 353 on each of the conductive pads 34.

Therefore, the method for fabricating an electrical connection structure of a circuit board proposed in the present invention continuously uses a conductive layer that is required in fabricating a patterned circuit structure on the circuit board, or forms a conductive layer on a preformed patterned circuit layer of the circuit board, in accompany with a resist layer to perform pattern transfer and cover areas not for forming conductive pads on the circuit board, such that the conductive pads are defined and exposed to be subsequently formed with conductive materials. Then, a first conductive material and a second conductive material are successively electroplated on an upper surface of each of the conductive pads and are sized similar to the upper surface each conductive pad, such that the conductive materials would have a relatively larger contact area with each conductive pad. Afterwards, a protective layer such as a solder mask layer is applied on the circuit board to cover the first and second conductive materials, and the protective layer is effectively attached to the conductive materials so as to increase the bonding strength of the conductive materials. Further, the protective layer is thinned by a surface etching process to expose the second conductive material that serves for electrically connecting the circuit board to an external device. In the present invention, the first and second conductive materials are formed prior to the protective layer on the circuit board, and the second conductive material is exposed by partly removing the protective layer using a thinning process such as the surface etching process, wherein the second conductive material is also cleaned during the thinning process. Compared to the conventional technology that a protective layer is firstly formed on a surface of an integrated circuit package substrate and covers the periphery of conductive pads, and then a solder material is deposited on the conductive pads using stencil printing technology, the present invention can solve an alignment problem in the conventional stencil printing technology, and also eliminate the drawbacks in the conventional technology such as difficulty in fabricating a stencil, increase in the fabrication costs, difficulty to pass the solder material through small grids of the stencil, wiping and cleaning of the stencil, and degradation of convenience and reliability in fabrication, which are caused by the grids of the stencil being reduced in size according to a reduced size and a reduced pitch of the conductive pads.

Moreover, it should be noted that the foregoing conductive pads in the present invention can be used as bump pads, pre-solder bump pads or ball pads of the circuit board. The drawings only show a part of the conductive pads. In reality, the number of conductive pads on the surface of the circuit board is flexibly adjusted depending on practical requirements, and the conductive pads can be disposed a single side or double sides of the circuit board.

The present invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method for fabricating an electrical connection structure of a circuit board, comprising the steps of:
   providing a circuit board having a circuit layer thereon, applying an insulating layer on a surface of the circuit board wherein the insulating layer is formed with a plurality of openings for exposing portions of the circuit layer, forming a conductive layer on a surface of the insulating layer and in the openings of the insulating layer, and applying a patterned first resist layer on the conductive layer to expose portions of the conductive layer, so as to form a plurality of conductive pads and conductive circuits on the conductive layer by an electroplating process and allow the conductive pads to be connected to the portions of the circuit layer;
   applying a second resist layer on the circuit board and forming a plurality of openings in the second resist layer to expose the conductive pads;
   successively forming a first conductive material and a second conductive material on each of the conductive pads by the electroplating process;
   removing the first and second resist layers and a part of the conductive layer covered by the first resist layer on the circuit board;
   applying a protective layer on the surface of the circuit board to cover the first and second conductive materials on each of the conductive pads; and
   thinning the protective layer to expose the second conductive material corresponding in position to each of the conductive pads.

2. The method of claim 1, wherein the conductive layer serves as a current conductive path for the electroplating process.

3. The method of claim 1, wherein the conductive layer is made of a metal material or an electrically conductive polymer material.

4. The method of claim 1, wherein the plurality of openings in the second resist layer are formed by exposing and developing processes or a laser drilling technique.

5. The method of claim 1, wherein the first conductive material and the second conductive material comprise the same metal material.

6. The method of claim 1, wherein the first conductive material and the second conductive material comprise different metal materials.

7. The method of claim 1, wherein the first conductive material comprises a copper metal layer, and the second conductive material is a solder material.

8. The method of claim 7, further comprising a step of performing a reflow-soldering process on the solder material to form a solder bump on each of the conductive pads.

9. The method of claim 1, wherein the protective layer is thinned by a plasma etching technique.

* * * * *